US010382024B2

(12) United States Patent
Ionescu

(10) Patent No.: US 10,382,024 B2
(45) Date of Patent: *Aug. 13, 2019

(54) SYSTEMS AND METHODS HAVING OMNIPOLAR COMPARATORS FOR MAGNETIC SWITCHES

(71) Applicant: Infineon Technologies AG, Neubiberg (DE)

(72) Inventor: Mihai Alexandru Ionescu, Bucharest (RO)

(73) Assignee: Infineon Technologies AG, Neubiberg (DE)

( * ) Notice: Subject to any disclaimer, the term of this patent is extended or adjusted under 35 U.S.C. 154(b) by 76 days.

This patent is subject to a terminal disclaimer.

(21) Appl. No.: 15/155,509

(22) Filed: May 16, 2016

(65) Prior Publication Data

US 2016/0277009 A1 Sep. 22, 2016

Related U.S. Application Data

(63) Continuation of application No. 14/065,798, filed on Oct. 29, 2013, now Pat. No. 9,341,682.

(51) Int. Cl.
| | | |
|---|---|---|
| *G01R 33/00* | (2006.01) | |
| *H03K 5/007* | (2006.01) | |
| *G01R 33/02* | (2006.01) | |
| *H03K 3/012* | (2006.01) | |
| *H03K 3/013* | (2006.01) | |
| *H03K 17/95* | (2006.01) | |
| *H03K 3/037* | (2006.01) | |
| *H03K 19/21* | (2006.01) | |
| *H03K 5/24* | (2006.01) | |

(52) U.S. Cl.
CPC ......... *H03K 5/007* (2013.01); *G01R 33/0029* (2013.01); *G01R 33/02* (2013.01); *H03K 3/012* (2013.01); *H03K 3/013* (2013.01); *H03K 3/0377* (2013.01); *H03K 17/95* (2013.01); *H03K 17/9512* (2013.01); *H03K 19/21* (2013.01); *H03K 5/2481* (2013.01)

(58) Field of Classification Search
CPC .... G01R 33/0029; G01R 33/00; G01R 33/02; G01R 33/072; H03K 3/013; H03K 3/012; H03K 17/9502
See application file for complete search history.

(56) References Cited

U.S. PATENT DOCUMENTS

| | | |
|---|---|---|
| 4,268,888 A | 5/1981 | Bodig et al. |
| 5,619,137 A | 4/1997 | Vig et al. |
| 6,356,741 B1 | 3/2002 | Bilotti et al. |

(Continued)

OTHER PUBLICATIONS

Notice of Allowance dated Jan. 20, 2016 U.S. Appl. No. 14/065,798.

(Continued)

*Primary Examiner* — Son T Le
(74) *Attorney, Agent, or Firm* — Eschweiler & Potashnik, LLC

(57) ABSTRACT

An omnipolar magnetic sensor system includes an input stage and a behavior component. The input stage is configured to receive a source signal and to selectively chop the source signal. Further, the input stage is configured to balance the source signal using behavior parameters and generate a balanced source signal.

25 Claims, 10 Drawing Sheets

(56) References Cited

U.S. PATENT DOCUMENTS

| | | |
|---|---|---|
| 6,622,012 B2 | 9/2003 | Bilotti et al. |
| 7,085,119 B2 | 8/2006 | Bilotti et al. |
| 7,307,824 B2 | 12/2007 | Bilotti et al. |
| 8,222,888 B2 | 7/2012 | David et al. |
| 2001/0012988 A1 | 8/2001 | Motz |
| 2010/0079138 A1* | 4/2010 | David ................ G01R 33/0047 324/251 |
| 2012/0229132 A1 | 9/2012 | Park et al. |
| 2012/0249124 A1* | 10/2012 | Ionescu ................ G01R 33/072 324/207.2 |

OTHER PUBLICATIONS

Non-Final Office Action dated Jul. 30, 2015 U.S. Appl. No. 14/065,798.

* cited by examiner

SYSTEMS AND METHODS HAVING OMNIPOLAR COMPARATORS FOR MAGNETIC SWITCHES

REFERENCE TO RELATED APPLICATION

This application is a continuation of U.S. application Ser. No. 14/065,798 filed on Oct. 29, 2013, the contents of which are incorporated by reference in their entirety.

BACKGROUND

Magnetic field switches, such as Hall effect sensors, are a type of magnetic sensor with a digital output that toggles from high to low and from low to high when certain levels of magnetic field intensity are sensed. These switches are often used for proximity sensing. The switches yield magnetic field versus output voltage characteristics that include a certain amount of hysteresis in order to provide noise immunity.

The output behavior of these switches can be unipolar, bipolar or omnipolar. In unipolar switches, the output is dependent upon both the magnitude of the field and the polarity. In omnipolar switches, the output is dependent upon the magnitude of the field and not the polarity. For some applications, omnipolar switch behavior is desired over unipolar in that the output does not depend on the polarity of the magnetic field. This may simplify operation and capture of desired behavior. However, omnipolar switches tend to have increased complexity over unipolar switched and require a polarity comparator in order to provide the omnipolar behavior. This increased complexity requires larger area and power consumption among other drawbacks.

DETAILED DESCRIPTION

Figure 1:
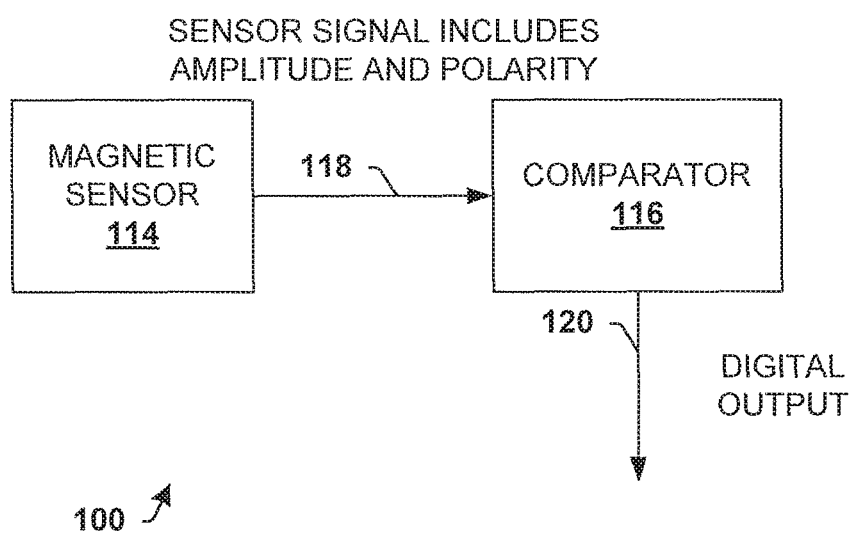
FIG. 1 is a block diagram illustrating an omnipolar magnetic sensor based system.

The present invention will now be described with reference to the attached drawing figures, wherein like reference numerals are used to refer to like elements throughout, and wherein the illustrated structures and devices are not necessarily drawn to scale.

Systems and methods are disclosed that facilitate magnetic sensors by providing omnipolar magnetic sensor behavior using simplified circuitry. The systems and methods incorporate a comparator that generates a digital output based on amplitude only of a sensor signal without requiring a polarity comparator or other complex circuitry.

FIG. 1 is a block diagram illustrating an omnipolar magnetic sensor based system 100. The system 100 measures a magnetic field and generates a digital output based on the measurement.

The system includes a sensor 114 and a comparator 116. The sensor 114 is a magnetic type sensor and measures a magnetic field. The sensor generates a sensor signal 118 that necessarily includes an amplitude and a polarity. The sensor amplitude ranges from zero to a max value and the polarity is considered positive or negative.

The comparator 116 generates a digital output 120 based on the sensor signal 118. The comparator 116 is sensitive only to the amplitude of the sensor signal 118. Thus, the comparator 116 is insensitive to the polarity. The comparator 116 internally generates and utilizes behavior parameters and chopping to generate the digital output 120 only based on the amplitude of the sensor signal 118. The behavior parameters are utilized to balance the signal.

Generally, the digital output 120 toggles from high to low and from low to high based on current and past values of the magnetic field, represented as the sensor signal 118, are reached. The output toggles when the amplitude increases to a first threshold value and decreases to a second threshold value, such as shown in the hysteresis loops shown below. The digital output 120 can be used for a variety of applications, such as proximity sensing, speed determination, and the like. An example of the digital output 120 is further described below.

Figure 2A:
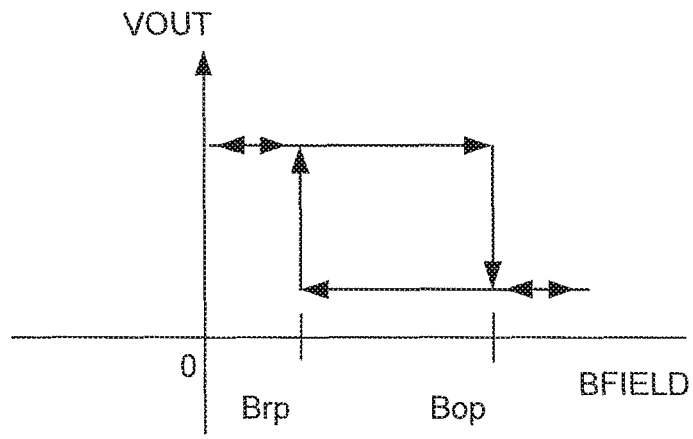
FIG. 2A is a graph depicting unipolar behavior of a magnetic sensor. In this example, the polarity of the magnetic field is always positive.

FIG. 2A is a graph depicting unipolar behavior of a magnetic sensor. In this example, the polarity of the magnetic field is always positive.

An x-axis depicts magnetic field increasing from zero going to the right and a y-axis depicts voltage increasing from zero. A representative digital output is shown.

There are two magnetic switch points or thresholds shown on the x-axis. A magnetic release point (BRP) and a magnetic operating point (BOP). The digital output switches from low to high decreasing to the BRP and switches from high to low on increasing to the BOP. The magnetic field remains positive in this example.

There are some other parameters related to this behavior. An offset is defined by (BOP+BRP)/2. A hysteresis is defined as (BOP−BRP).

Figure 2B:
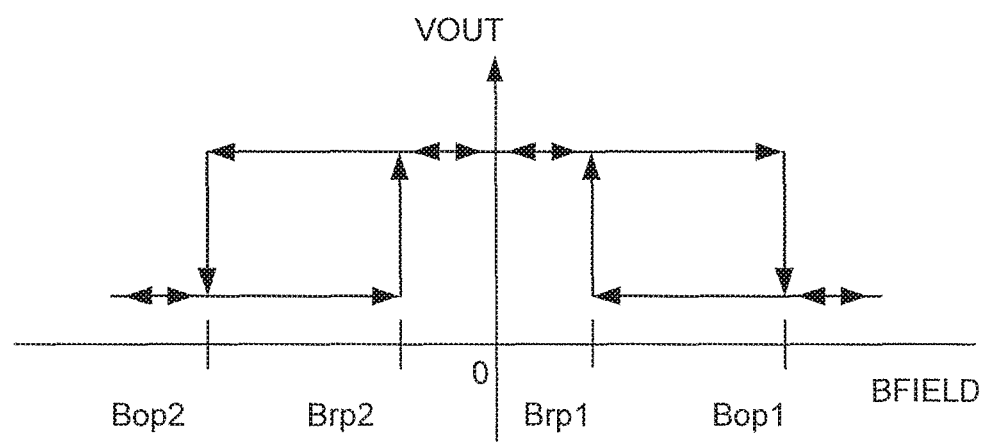
FIG. 2B is a graph depicting omnipolar behavior of a magnetic sensor.

FIG. 2B is a graph depicting omnipolar behavior of a magnetic sensor. In this example, the polarity of the magnetic field is positive or negative.

An x-axis depicts a magnetic field increasing from negative values on the left to positive values on the right and a y-axis depicts voltage increasing from zero. A representative digital output exhibiting omnipolar behavior is shown.

In one example, the digital output shown in the figure is generated by the system 100 described above as the digital output 120.

Here, there are four switching points or thresholds shown on the x-axis, a first magnetic operating point (BOP1), a first magnetic release point (BRP1), a second magnetic operating point (BOP2), and a second magnetic release point (BRP2).

The BOP1 and BRP1 are along a positive portion of the x-axis and the BOP2 and BRP2 are along a negative portion of the x-axis.

While the magnetic field is positive, the digital output switches from high to low on increasing amplitude/magnitude of the magnetic field as it reaches the BOP1. On the field decreasing from to the BRP1 value, the digital output switches from low to high.

When the magnetic field is negative, the digital output switches from high to low on the modulus of the amplitude increasing to the BOP2. On the modulus of the field magnitude decreasing to BRP2, the digital output switches from low to high.

There are several omnipolar behavior related parameters. These include a first offset, a second offset, a first hysteresis and a second hysteresis. The first offset, also referred to as a positive offset, is (BOP1+BRP1)/2. The second offset, also referred to as a negative offset, is (BOP2+BRP2)/2. Ideally, the first and second offset are equal, however fabrication mismatches and the like tend to yield variations. The first hysteresis, also referred to as a positive hysteresis, is defined as BOP1−BRP1. The second hysteresis, also referred to as a negative hysteresis, is defined as BOP2−BRP2. Again, ideally, the first and second hysteresis are equal. However, fabrication mismatches and the like tend to yield variations between the first and second hysteresis values.

As stated above, the first and second offset should be substantially equal and the first and second hysteresis should be substantially equal for proper omnipolar behavior. This characteristic is referred to as symmetry. With symmetry, the same magnitude of the magnetic field, whether positive or negative, yields the same digital output. The system 100 provides the symmetry without requiring a polarity comparator.

Figure 3:
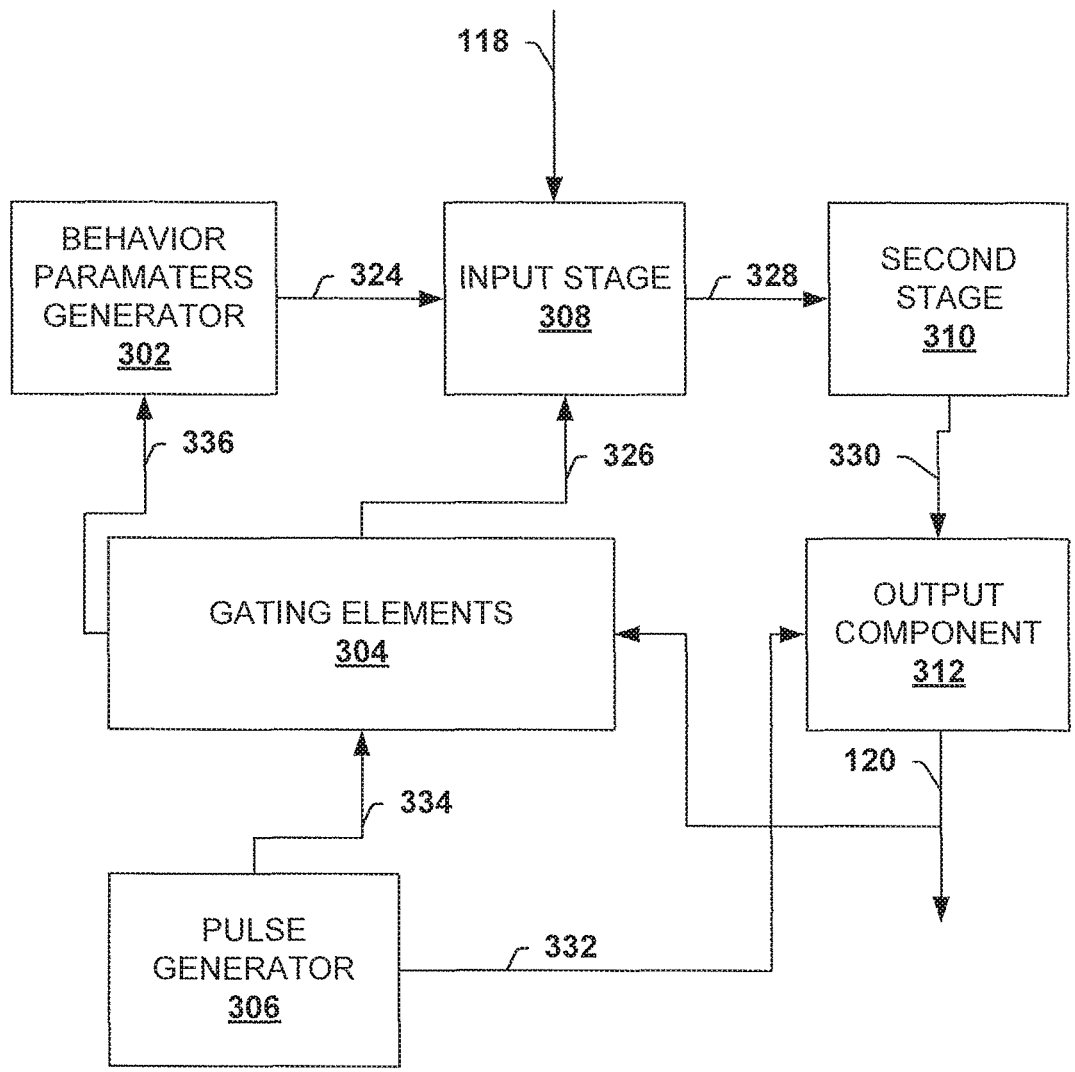
FIG. 3 is a block diagram illustrating a comparator.

FIG. 3 is a block diagram illustrating a comparator 300 that can be utilized in the above system 100. The comparator 300 receives the sensor signal 118 having both polarity and magnitude components and generates the digital output 120 based only on the magnitude component.

The comparator 300 includes a behavior parameters generator 302, gating elements 304, a pulse generator 306, an input stage 308, a second stage 310, and an output component 312. The comparator 300 receives the sensor signal 118, which includes a polarity component and an amplitude component. The sensor signal 118 is a measurement of a magnetic field provided by a magnetic sensor. The comparator 300 generates the digital output 120 based on only the amplitude component of the sensor signal 118.

The sensor signal 118 is received at the input stage 308. The input stage 308 also receives behavior parameters 324 and first gating outputs 326. Based on the inputs, the input stage 308 generates a first stage output 328. The first gating outputs 326 are used to chop or toggle the received sensor signal 118. Further, the input stage 308 utilizes the behavior parameters 324 to make the hysteresis values and offsets substantially symmetrical, which is referred to as balancing. Thus, the first stage output 328 is balanced.

The second stage 310 amplifies the first stage output 328 and generates a second stage output 330. The second stage output 330 is received by the by the output component 312. The output component 312 generates the digital output 120 from the second stage output 330 based on a pulse 332 from the pulse generator 306.

The pulse generator 306 generates the pulse 332 and one or more intermediate pulse signals 334. The pulse generator 306 utilizes a clock signal at a selected frequency to generate the signals 332 and 334. The gating elements 304 generate the first gating outputs 326 and second outputs 336 from the intermediate pulse signals 334 and the digital output signal 120.

The behavior parameters generator 302 generates the parameters 324 used by the input stage 308 to balance the input sensor signal 118. In one example, the parameters 324 include a hysteresis current (Ihys) and an offset current (Iuni).

FIGS. 4A-4D are provided as a more detailed example of a suitable comparator that can be used in the system 100. It is appreciated that variations in the circuits and components are contemplated.

Figure 4A:
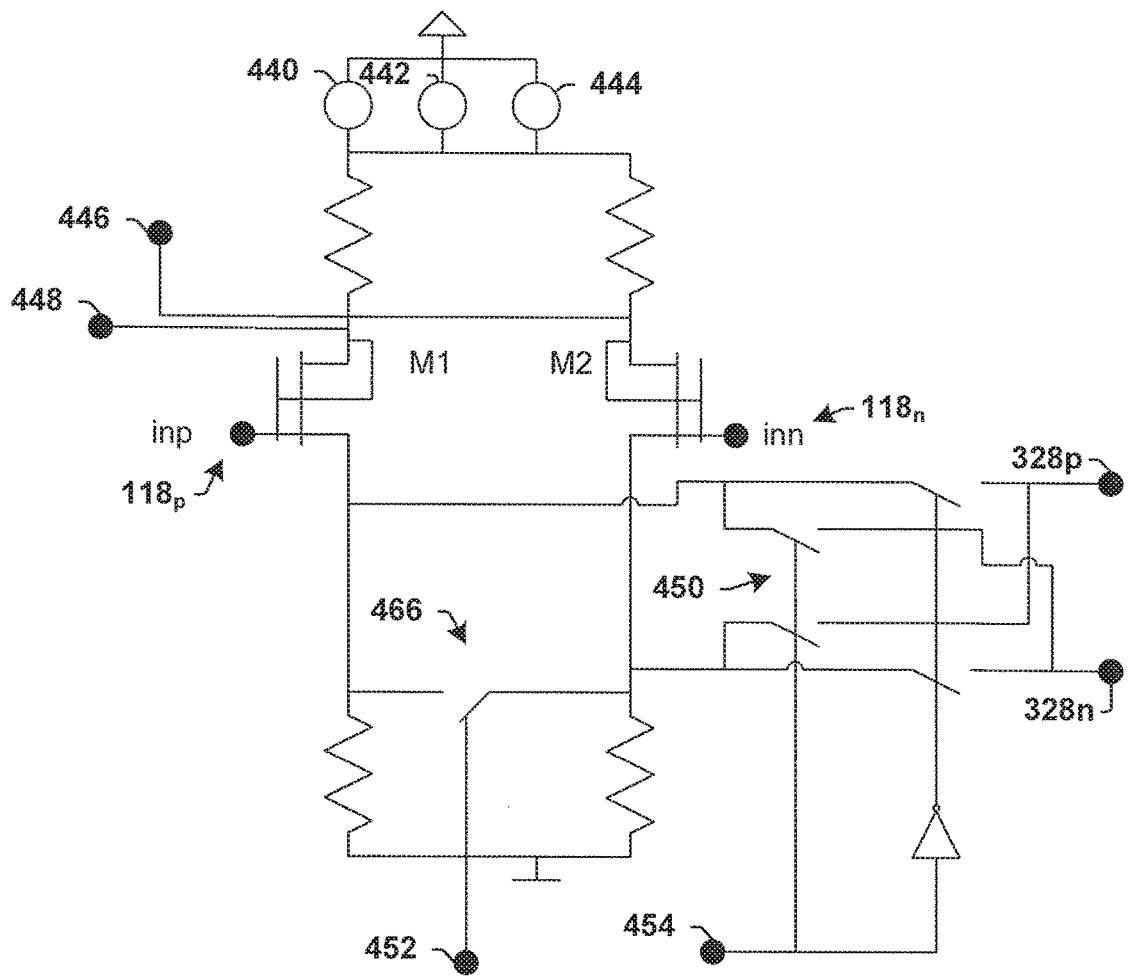
FIG. 4A is a diagram illustrating an input stage of a comparator.

FIG. 4A is a diagram illustrating an input stage 308 of a comparator. The input stage 308 receives a sensor signal 118 as a differential input and generates a first stage output 328 that is balanced.

The input stage 308 includes a hysteresis current source 440, an offset current source 442 and a bias current 444. The stage 308 receives behavior parameters from terminals 446 and 448. The sensor signal 118 is received as a differential signal at transistors M1 and M2.

The input stage 308 includes a first switch 466 actuated by a pulsed control signal from the terminal 452. The switch 466 is used to selectively short the drains of transistors M1 and M2. Toggling switches 450 are actuated by a signal from the terminal 454. The toggling switches 450 are configured to toggle the paths from the differential inputs 118 to the outputs 328.

Figure 4B:
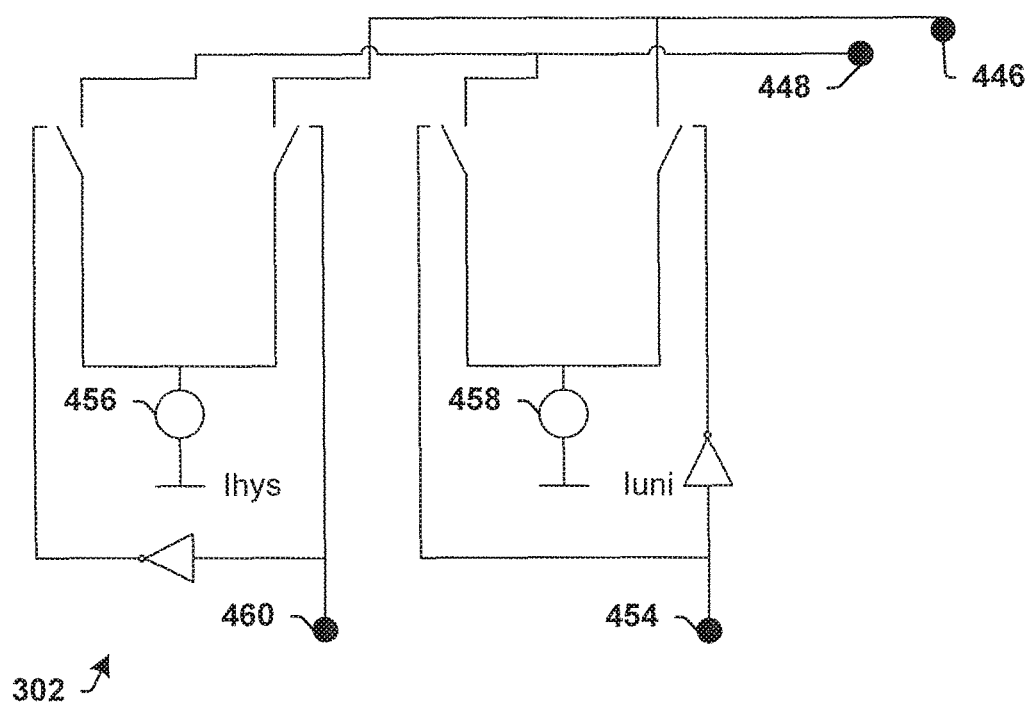
FIG. 4B is a diagram illustrating a behaviors parameter generator.

FIG. 4B is a diagram illustrating a behaviors parameter generator 302. The generator 302 selectively provides behavior parameters to the input stage 308. In this example, the behavior parameters include a hysteresis current and an offset current, which are provided at the terminals 446 and 448. The generator 302 includes a hysteresis behavior current source 456 and an offset behavior current source 458.

Figure 4C:
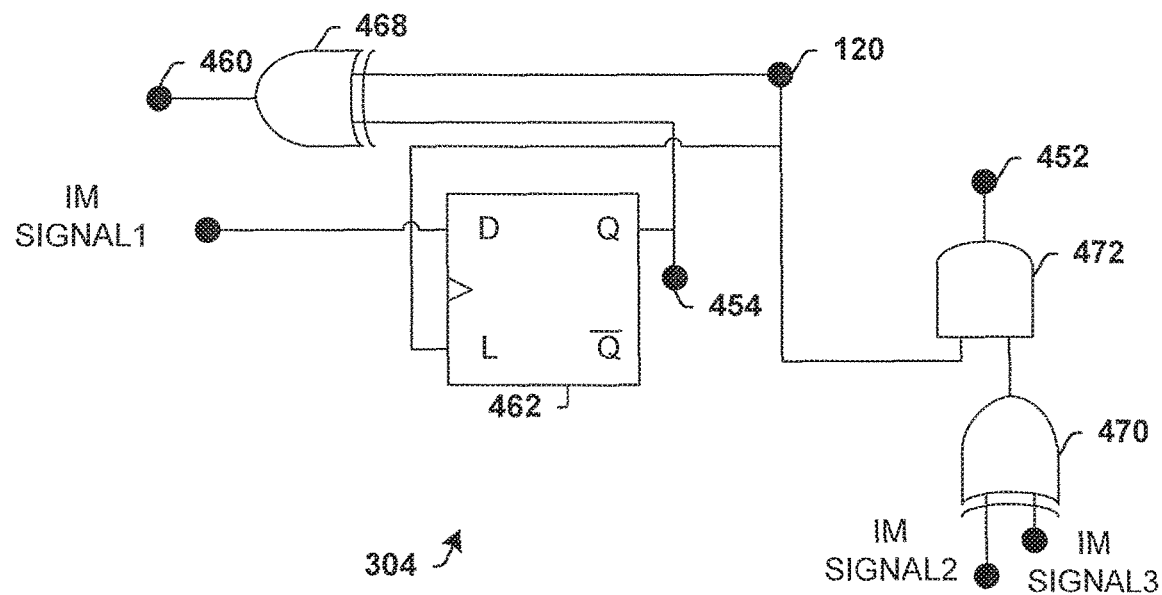
FIG. 4C is a diagram illustrating gating elements that can be used in a comparator.

FIG. 4C is a diagram illustrating gating elements 304 that can be used in a comparator. The gating elements 304 include an auxiliary latch component 462, a first XOR 468, a second XOR 470, and an AND gate 472.

The auxiliary latch component 462 receives a first intermediary pulse signal from a pulse generator and is enabled by the digital output signal 120. The first XOR 468 provides an exclusive OR at its output based on the digital output signal 120 and an output (Q) of the latch component 462. The output of the first XOR 468 is provided to a hysteresis side of the behavior parameter generator 302 via the terminal 460. The output (Q) 454 of the auxiliary latch component 462 is used to toggle the hysteresis current, the offset current, and the switches 450.

A second XOR 470 receives a second intermediary pulse signal (IM SIGNAL2) and a third intermediary pulse signal (IM SIGNAL3). The third intermediary pulse signal is delayed from the second intermediary pulse signal. The output of the second XOR 470 is ANDed with the digital output signal 120 and provided as a signal to the terminal 452. This signal is used to control the switch 466 of the input stage 308. The switch 466 is used to selectively short the drains of transistors M1 and M2.

Figure 4D:
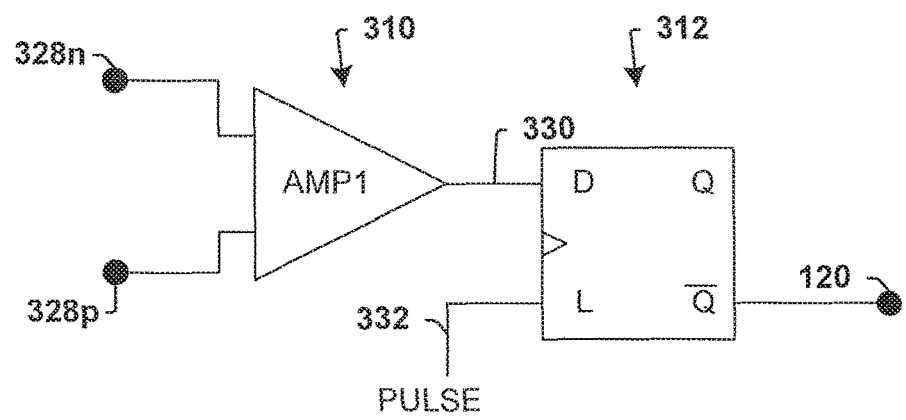
FIG. 4D is a diagram illustrating a second stage and output component for a comparator.

FIG. 4D is a diagram illustrating a second stage and output component for a comparator. Collectively, these components receive the balanced signal 328 and generate the digital output signal 120.

The second stage 310 is shown as an amplifier (AMP1) configured to receive the balanced signal 328 as differential portions, 328*n* and 328*p*. The second stage 310 generates the second stage output 330 by applying a selected gain. The output stage 312, in this example, is a D flip flop or latch.

The latch input (D) is configured to receive the second stage output and is enabled (L) according to the pulse signal 332. The complimentary output ($\overline{Q}$) provides the digital output signal 120.

The pulse generator 306 of FIG. 3 generates the pulse signal 332 based on a square wave signal with a selected number of delays. When the pulse signal 332 is low, the input (D) of the output stage (latch) 312 can change, but the output stage 312 prevents input changes from propagating to the output signal 120. When the pulse signal 332 is high, input changes 330 do propagate to the output signal 120.

Generally, while the output of the comparator, the digital output signal 120, is logic high, the sensor signal 118 is chopped in the input stage 308, so the second stage 310 receives the amplified input (as 328), with the hysteresis and offset currents applied. Then, the second stage 310 receives an inverted input, with the hysteresis and offset currents also inverted during the other clock stage. This continues until one of the BOP1 and BOP2 thresholds is reached. At this point, the digital output signal 120 is logic low, causing chopping to halt until the electric signal decreases and reaches one of the BRP thresholds, where the chopping starts again.

Figure 5:
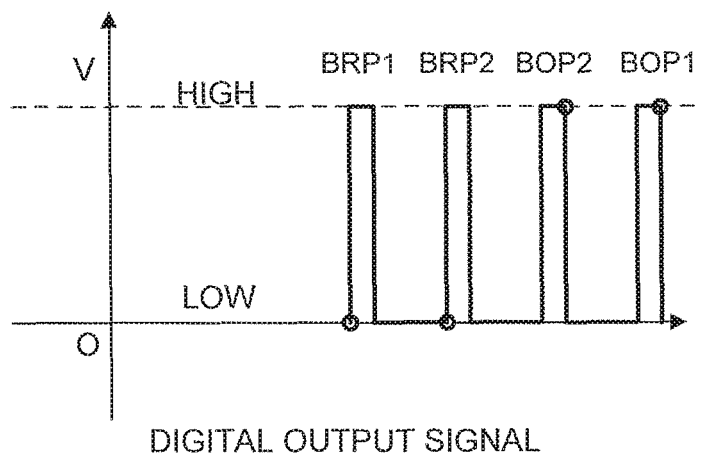
FIG. 5 is a graph illustrating example omnipolar behavior and digital output for a comparator.
Figure 5:
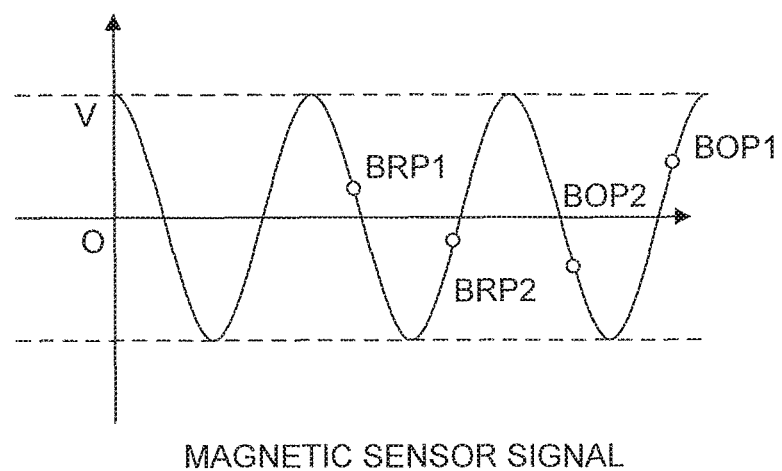

FIG. 5 is a graph illustrating example omnipolar behavior and digital output for a comparator, such as the comparator 300 described above. The graph is intended to facilitate understanding and is not meant to limit.

The graph 500 includes an upper graph depicting a digital output signal and a lower graph depicting a magnetic sensor signal. The digital output signal is an example of a digital output signal 120, described above. It can be seen that the digital output signal varies for a low logic value to a high logic value.

The magnetic sensor signal is a signal generated by a magnetic sensor, such as the sensor signal 118 described above. The magnetic sensor signal includes an amplitude and a polarity, positive or negative.

Some examples of changing values of the sensor signal and the response in the digital output signal are provided. Less or greater than refers to the absolute value of the amplitude, without polarity. Beginning with the sensor signal at a positive polarity and an amplitude greater than the BRP1 threshold, the sensor signal decreases and reaches the BRP1 threshold. At this point, the digital output signal goes from logic low to logic high. Beginning with the sensor signal at the negative polarity and with an amplitude greater than the BRP2, the sensor signal decreases and reaches the BRP2 threshold. At this point, the digital output signal changes from logic low to logic high.

Beginning with the sensor signal having positive polarity and increasing, the sensor signal reaches the BOP1 threshold. Here, the digital output signal goes from logic high to logic low. Similarly, with the sensor signal having negative polarity and increasing, the sensor signal reaches the BOP2 threshold. At this point, the digital output signal also goes from logic high to logic low.

Figure 6:
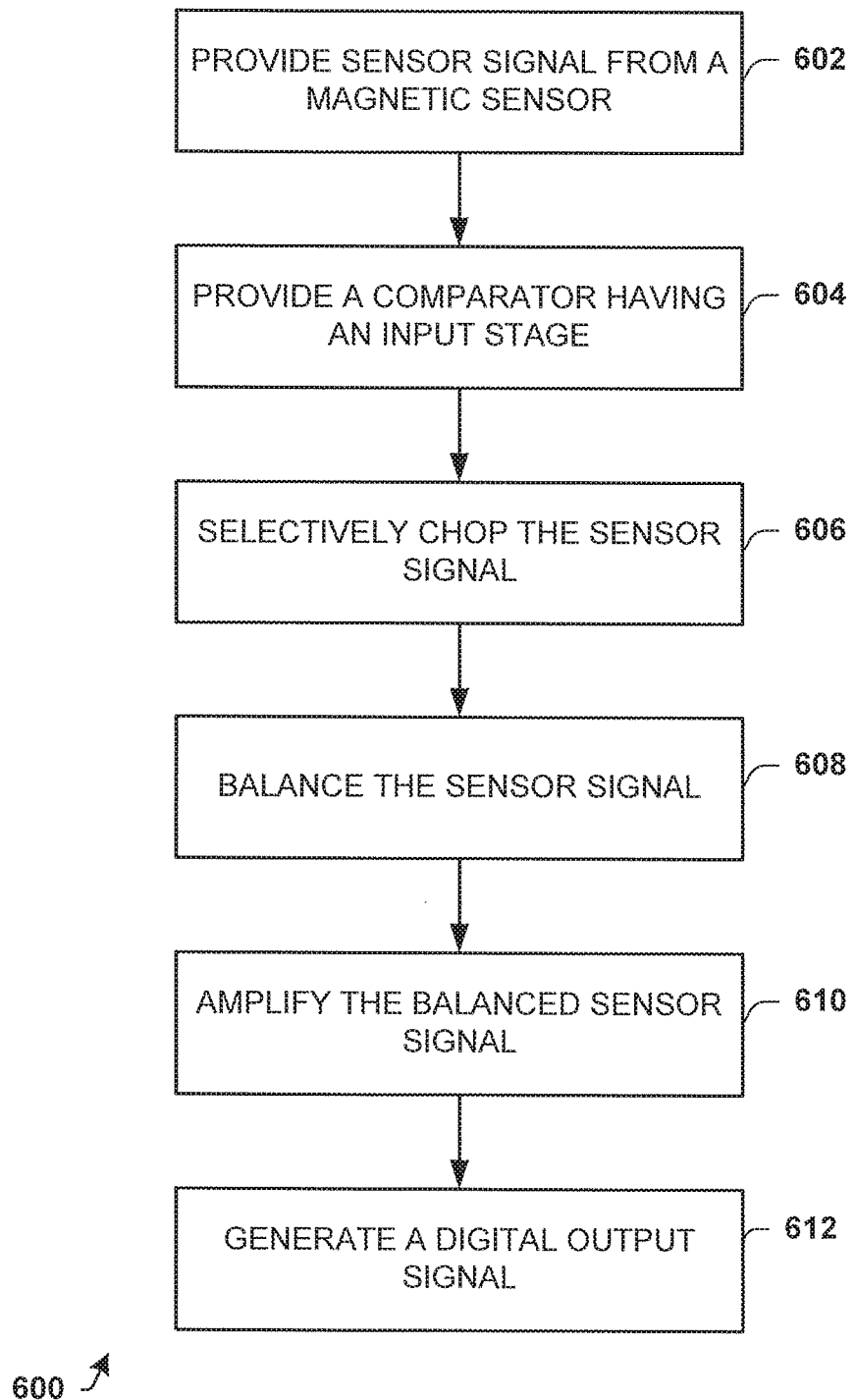
FIG. 6 is a flow diagram illustrating a method of operating a magnetic sensor comparator system.

FIG. 6 is a flow diagram illustrating a method 600 of operating a magnetic sensor comparator system. The above systems and components can be referenced to facilitate understanding of the method 600. Further, the method 600 can be at least partially incorporated by the above systems and/or components.

The method 600 generates a digital output signal from a receives magnetic sensor signal. The output signal is generated and based on omnipolar behavior according to omnipolar BOP and BRP threshold values.

The method 600 begins at block 602, wherein the magnetic sensor signal is provided. The sensor signal includes a polarity (positive or negative) and an amplitude value. The sensor signal is provided by a magnetic sensor and is a measurement of a magnetic field located at the magnetic sensor. The sensor signal has a frequency or range of frequencies associated therewith.

A comparator having an input stage and a second stage is provided at block 604. The comparator does not include a polarity comparator. The input stage is configured to receive the sensor signal and selectively perform chopping. In one example, the input stage includes switches that are selectively toggled at a chopping frequency in order to chop the signal. The chopping frequency exceeds the frequency of the magnetic sensor signal.

Furthermore, the input stage is also configured to selectively incorporate hysteresis and offset adjustments to balance the signal. The second stage amplifies an input signal. It is appreciated that other stages and/or components may be present in the comparator.

The sensor signal is selectively chopped at block 606. In one example, the sensor signal is chopped once the modulus of the amplitude of the signal has reached a BRP threshold until the amplitude increases to a BOP threshold. The input stage is configured to selectively chop the sensor signal. In one example, the chopping frequency is at least 10 times the frequency of the sensor signal. The chopping is stopped once a BOP threshold has been reached. In one example, the settling time is smaller than double the chopping frequency. Once the signal decreases below the BRP, the chopping restarts.

It is noted that during the chopping, the outputs of the auxiliary latch 462 and the AND gate 472, described above, are toggled.

The sensor signal is balanced for offset and hysteresis at block 608. The signal is balanced by causing the positive offset and negative offset to be substantially equal and causing the positive and negative hysteresis to be substantially equal. In one example, a hysteresis current and an offset current are used at the input stage to balance the signal. The hysteresis current and the offset current are inverted until one of the BOP thresholds is reached, i.e., during the chopping.

The balanced sensor signal is amplified at block 610. The second stage is used to selectively amplify the balanced sensor signal to provide a balanced amplified signal at its output. The balanced signal is amplified according to a selected gain. It is appreciated that additional amplification stages can be present.

The amplified signal is then used to generate a digital output signal according to a pulse clock at block 612. The digital output signal represents omnipolar behavior of the sensor signal in response to only the amplitude/magnitude of the sensor signal. Thus, on the amplitude increasing and reaching the BOP threshold, the digital output signal transitions to a logic low value and on the amplitude decreasing and reaching the BRP threshold, the digital output signal transitions to a logic high value. The digital output signal may then be used for other applications, such as presence detection, proximity detection, speed determination, and the like.

It is appreciated that the above methods and variations thereof can be combined and utilized interchangeably.

While the above methods are illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein. Also, one or more of the acts depicted herein may be carried out in one or more separate acts and/or phases.

Figure 7:
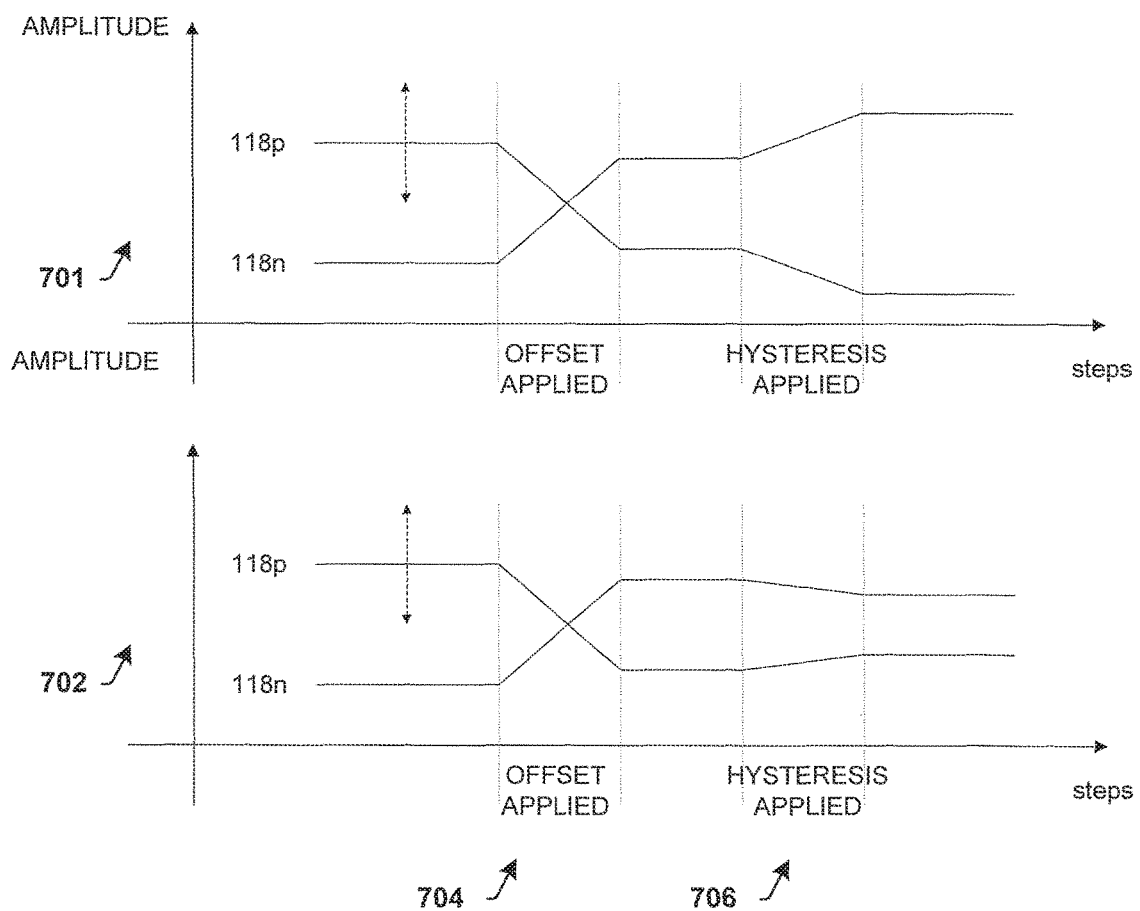
FIG. 7 is a graph depicting example unipolar behavior in response to input signals.

FIG. 7 is a graph depicting example unipolar behavior in response to input signals for the above systems and methods. The graph is described in reference to FIGS. 4A to 4D, but applies to the other systems and methods as well. This example is restricted to unipolar behavior to facilitate understanding. The graph includes a first example signal 701 and a second signal 702.

An x-axis depicts steps or time and a y-axis depicts amplitude. A differential input signal denoted by 118p and 118n is shown propagating through an input stage, such as the stage 308. For the first signal 701, an offset is applied at 704. The offset utilizes the offset current from the behavior parameters. The offset cause the signals to invert. The hysteresis current is applied at 706 causing the signals to diverge. The output 120 toggles from high to low when the two lines intersect after the hysteresis is applied.

For the second signal 702, an offset is applied at 704. The offset utilizes the offset current causes the signals to invert. The hysteresis current is applied at 706, which causes the signals to converge, in this example. The output 120 toggles from low to high when the signals intersect after the hysteresis is applied.

Figure 8:
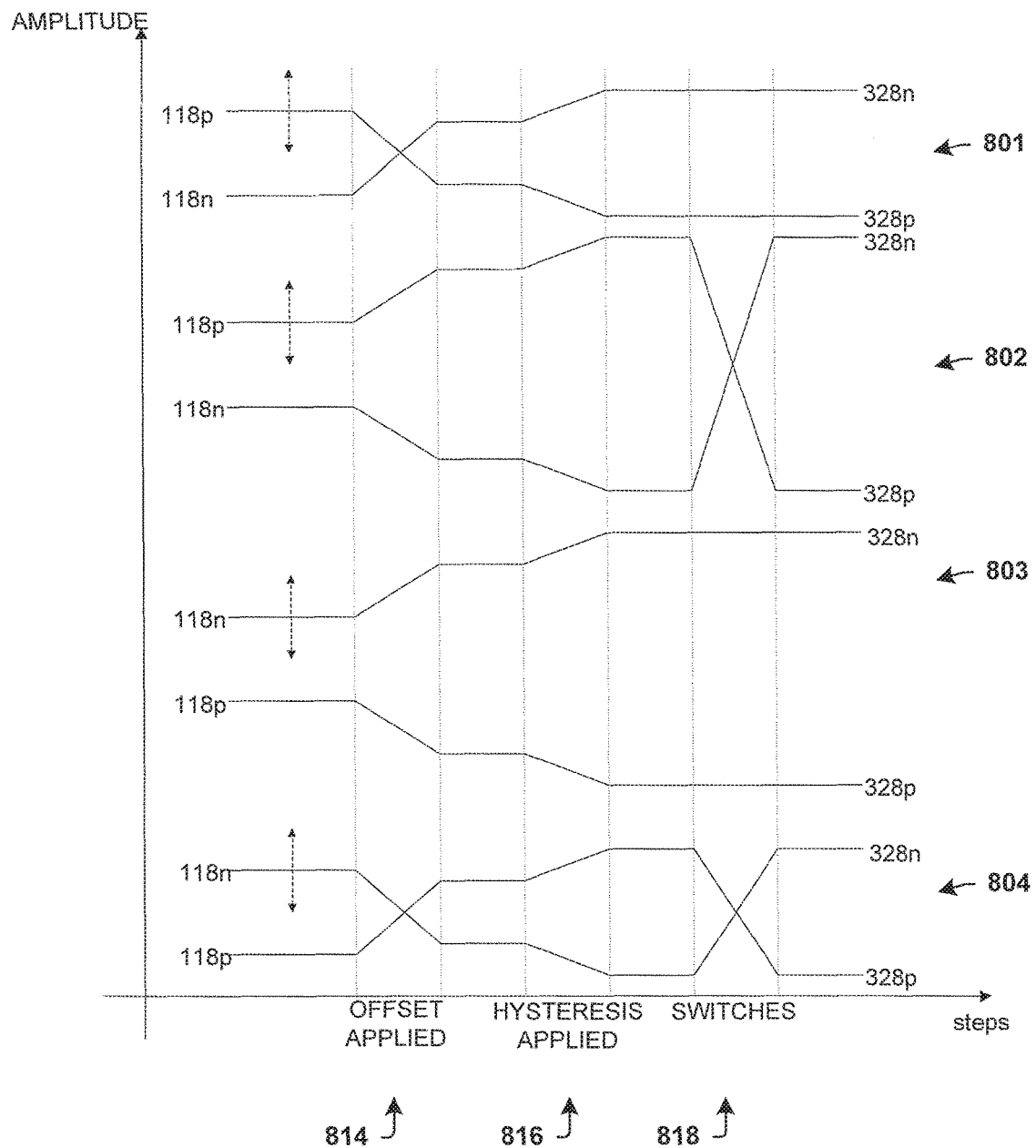
FIG. 8 is a graph depicting example behavior in response to input signals.

FIG. 8 is a graph depicting example behavior in response to input signals for the above systems and methods. The graph is described in reference to FIGS. 4A to 4D, but applies to the other systems and methods as well. This example describes omnipolar behavior. The graph describes a first differential input signal 801, a second differential input signal 802, a third differential input signal 803 and a fourth differential input signal 804. Each differential signal corresponds to inputs 118p and 118n, shown in FIG. 4A.

An x-axis depicts steps or time and a y-axis depicts amplitude. A differential input signal denoted by 118p and 118n is shown propagating through an input stage, such as the stage 308. An offset current is applied at 814 and a hysteresis current is applied at 816 and switches 450 selectively invert the signals at 818 if 118p is greater than 118n. The right side is the output signal of the input stage, designated as 328p and 328n, which are also described with respect to FIGS. 4A, 4B, 4C and 4D. Essentially, in this example, if 328p is less than 328n, the output signal 120 goes logic high. If the 328p is greater than 328n, the output signal 120 goes logic low.

For the first signal 801, the output 120 toggles if the difference between 118p and 118n is large enough. When the offset is applied, the signals are inverted.

For the second signal 802, the output 120 does not toggle no matter how much the different between 118p and 118n increases.

For the third signal 803, the output 120 also does not toggle no matter how much the different between 118n and 118p increases to.

For the fourth signal 804, the output 120 toggles if the different between 118n and 118p is large enough.

It is appreciated that the claimed subject matter may be implemented as a method, apparatus, or article of manufacture using standard programming and/or engineering techniques to produce software, firmware, hardware, or any combination thereof to control a computer to implement the disclosed subject matter (e.g., the systems shown above, are non-limiting examples of system that may be used to implement methods). The term "article of manufacture" as used herein is intended to encompass a computer program accessible from any computer-readable device, carrier, or media. Of course, those skilled in the art will recognize many modifications may be made to this configuration without departing from the scope or spirit of the claimed subject matter.

An omnipolar magnetic sensor system includes an input stage and a behavior component. The input stage is configured to receive a source or sensor signal and to selectively chop the sensor signal. Further, the input stage is configured to balance the source signal using behavior parameters and generate a balanced source signal.

An omnipolar magnetic sensor system includes a magnetic sensor and a comparator. The magnetic sensor is configured to measure a magnetic field and to generate a sensor signal having an amplitude and a polarity. The comparator is configured to receive the sensor signal and generate a digital output based on omnipolar behavior. The comparator utilizes behavior parameters and chops the sensor signal on the digital output being logic high.

A method of operating a magnetic sensor system is disclosed. A magnetic field is measured to generate a sensor signal having an amplitude and a polarity based on the magnetic field. The sensor signal is balanced using behavior parameters to generate a balanced sensor signal. The balanced sensor signal is chopped on a digital output signal being at a first logic value. The digital output signal is generated from the balanced sensor signal, where the digital output signal is based on only the amplitude of the magnetic signal.

In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A signal processing system comprising:
    an input stage configured to receive at least one source signal, to balance the at least one source signal using behavior parameters to generate an at least one balanced source signal, and to selectively chop the at least one balanced source signal to generate at least one chopped balanced signal;
    an output component configured to generate a digital output signal from the at least one chopped balanced signal; and
    a behavior component configured to generate the behavior parameters and a signal used to chop or toggle the at least one balanced source signal according to the digital output and an intermediary signal from a pulse generator, wherein the behavior parameters include a hysteresis signal and an offset signal, wherein the behavior component includes a hysteresis signal generator configured to generate the hysteresis signal using one or more hysteresis switches configured to toggle output of the hysteresis signal based on the intermediary signal and an offset signal generator configured to generate the offset signal using one or more offset switches configured to toggle output of the offset signal based on the intermediary signal.

2. The system of claim 1, wherein the digital output is a logic high on the amplitude of the at least one source signal increasing above a threshold value and goes to a logic low on the amplitude of the at least one source signal increasing to a second threshold value.

3. The system of claim 2, wherein the digital output goes from logic low to logic high on the amplitude of the at least one source signal decreasing to the threshold value.

4. The system of claim 1, wherein the behavior parameters are inverted on the amplitude of the at least one source signal increasing above a threshold value.

5. The system of claim 1, wherein the input stage is configured to stop chopping the at least one source signal on its amplitude increasing above a second threshold value.

6. The system of claim 1, wherein the input stage is configured to chop the at least one source signal on its amplitude decreasing to a threshold value.

7. The system of claim 6, wherein the comparator includes an input stage configured to generate the balanced signal.

8. The system of claim 1, wherein the output component comprises a latch that operates in response to a pulse signal from the pulse generator.

9. The system of claim 1, further comprising gating elements coupled to the input stage and the behavior component and comprising an auxiliary latch configured to receive the intermediary signal and to provide an output to toggle one of the behavior parameters.

10. The system of claim 1, further comprising a second stage configured to amplify the chopped balanced signal to generate an amplified signal.

11. The system of claim 1, wherein the at least one balanced source signal is substantially symmetrical with respect to hysteresis and offset values.

12. The system of claim 1, wherein the hysteresis signal generator of the behavior component comprises a hysteresis current generator and the one or more hysteresis switches are configured to toggle an output of the hysteresis current generator based on the intermediary signal.

13. The system of claim 1, wherein the offset signal generator of the behavior component comprises an offset current generator and the one or more offset switches are configured to toggle an output of the offset current generator based on the intermediary signal.

14. An omnipolar magnetic sensor system comprising:
a magnetic sensor configured to measure a magnetic field and to generate a sensor signal having an amplitude and a polarity;
a comparator configured to receive the sensor signal, to generate a balanced signal from the sensor signal using behavior parameters, to selectively chop the balanced signal to generate a chopped balanced signal, and to generate a digital output based on omnipolar behavior and the chopped balanced signal, wherein the comparator utilizes the behavior parameters and chops the balanced signal on the digital output being at a predefined value; and
a behavior component configured to generate the behavior parameters and a signal used to chop or toggle the balanced signal according to at least the digital output, wherein the behavior parameters include a hysteresis signal and an offset signal, wherein the behavior component includes a hysteresis signal generator configured to generate the hysteresis signal using one or more hysteresis switches configured to toggle output of the hysteresis signal based on an intermediary signal and an offset signal generator configured to generate the offset signal using one or more offset switches configured to toggle output of the offset signal based on the intermediary signal.

15. The system of claim 14, wherein the comparator includes a pulse generator configured to generate a delayed pulse and utilizes the delayed pulse to generate the digital output.

16. The system of claim 14, wherein the comparator is configured to chop the balanced signal at a chopping frequency.

17. The system of claim 16, wherein the chopping frequency is greater than 10 times a frequency of the sensor signal.

18. The system of claim 14, wherein the predefined value is logic high.

19. The omnipolar sensor system according to claim 14; wherein the comparator is further configured to generate an amplified signal from the chopped balanced signal.

20. The system of claim 14, wherein the comparator is further configured to stop chopping the balanced signal on a magnetic operating point (BOP) being reached.

21. The system of claim 20, wherein the comparator is further configured to stop chopping the balanced signal on a magnetic release point (BRP) being reached.

22. A method of operating a magnetic sensor system, the method comprising:
measuring a magnetic field to generate a sensor signal having an amplitude and a polarity based on the magnetic field;
balancing the sensor signal using behavior parameters to generate a balanced sensor signal;
chopping the balanced sensor signal on a digital output signal being a first logic value;
generating the digital output signal from the chopped balanced signal, wherein the digital output signal is based on only the amplitude of the magnetic signal; and
generating a hysteresis signal using one or more hysteresis switches configured to toggle output of the hysteresis signal based on an intermediary signal and generating an offset signal using one or more offset switches configured to toggle output of the offset signal based on the intermediary signal and generating a signal to chop or toggle the balanced sensor signal according to the digital output and the intermediary signal from a pulse generator.

23. The method of claim 22, further comprising generating the behavior parameters according to the digital output signal and an intermediary delayed pulse signal.

24. The method of claim 22, further comprising amplifying the balanced sensor signal prior to generating the digital output signal.

25. The method of claim 22 further comprising amplifying the chopped balanced signal to generate an amplified signal.

* * * * *